United States Patent
Sato

(10) Patent No.: US 8,064,282 B2
(45) Date of Patent: Nov. 22, 2011

(54) METHOD OF ACCESSING SYNCHRONOUS DYNAMIC RANDOM ACCESS MEMORY, MEMORY CONTROL CIRCUIT, AND MEMORY SYSTEM INCLUDING THE SAME

(75) Inventor: Shinsuke Sato, Chiba (JP)

(73) Assignee: Kawasaki Microelectronics Inc., Chiba (JP)

( * ) Notice: Subject to any disclaimer, the term of this patent is extended or adjusted under 35 U.S.C. 154(b) by 245 days.

(21) Appl. No.: 12/289,446

(22) Filed: Oct. 28, 2008

(65) Prior Publication Data

US 2009/0109784 A1 Apr. 30, 2009

(30) Foreign Application Priority Data

Oct. 30, 2007 (JP) ................................. 2007-281979

(51) Int. Cl.
*G11C 8/00* (2006.01)
(52) U.S. Cl. ............... 365/230.03; 365/222; 365/230.01
(58) Field of Classification Search .................. 365/222, 365/230.03, 230.01
See application file for complete search history.

(56) References Cited

U.S. PATENT DOCUMENTS

| 4,482,979 A | 11/1984 | May |
| 4,587,559 A | 5/1986 | Longacre, Jr. et al. |
| 4,737,780 A | 4/1988 | Ishii |
| 4,802,118 A | 1/1989 | Honda et al. |
| 6,125,432 A * | 9/2000 | Hanami et al. ................. 711/157 |
| 7,023,413 B1 | 4/2006 | Terashima et al. |

FOREIGN PATENT DOCUMENTS

| JP | A-57-10879 | 1/1982 |
| JP | A-62-51095 | 3/1987 |
| JP | A-08-204921 | 8/1996 |
| JP | A-2000-284771 | 10/2000 |
| JP | A-2000-315386 | 11/2000 |
| JP | A-2003-68072 | 3/2003 |

* cited by examiner

*Primary Examiner* — Huan Hoang
(74) *Attorney, Agent, or Firm* — Oliff & Berridge, PLC

(57) ABSTRACT

An access area is set within an address space of a dynamic random access memory by arranging two or more complete columns of blocks, in which blocks of memory cells are arranged within an entirety of a specified range of row addresses, along a direction of column addresses. Each of the blocks includes memory cells positioned at a same row address and a specified number of consecutive column addresses. The total number of blocks arranged in the access area is just capable of storing the number of words of the data to be stored. The two or more complete columns of blocks are successively accessed by successively accessing the blocks arranged in each of the columns of blocks. Thereby, a refresh operation of the dynamic random access memory is made unnecessary.

23 Claims, 8 Drawing Sheets

METHOD OF ACCESSING SYNCHRONOUS DYNAMIC RANDOM ACCESS MEMORY, MEMORY CONTROL CIRCUIT, AND MEMORY SYSTEM INCLUDING THE SAME

BACKGROUND

This application claims priority from Japanese Application No. 2007-281979, filed on Oct. 30, 2007, which is hereby incorporated by reference herein in its entirety.

BACKGROUND OF THE INVENTION

This invention relates to methods of accessing synchronous dynamic random access memories, and memory control circuits that control random access memories using the methods of accessing. This invention also relates to memory systems including synchronous dynamic random access memories and memory control circuits that control random access memories.

In conventional image processing circuits, input image data constituting a frame is temporarily stored in a buffer memory, and is then read from the buffer memory, processed, and output.

For this purpose, dynamic random access memories (DRAMs) are often used as buffer memories because of the low costs associated with DRAMs.

DRAMs must be refreshed periodically in order to maintain the data stored in the memory cells of the DRAMs. However, accessing one of the memory cells has an effect equivalent to refreshing the accessed cell and those cells having the same row address.

Japanese laid-open patent 2003-68072 (Patent Document 1) describes a technique for accessing a DRAM in which a read/write operation is preformed by incrementing the row address. When the row address exceeds the maximum row address, the column address is incremented and the row address is initialized to zero so that the addresses are circulated a plurality of times during a frame period. Thereby refresh cycle of the DRAM becomes unnecessary.

When the operation temperature is high, however, the refresh period required to maintain the data in DRAMs may become shorter than a frame period. In the technique described in Patent Document 1, each of the row addresses is accessed twice or more times in each frame period when the size of image data is large and the row address reaches to the maximum row address twice or more times within each frame period. When the size of image data is small and the row address reaches the maximum row address only once during a frame period, however, some of the row addresses are accessed only once during each frame period. The cells having row addresses that are accessed only once during each frame period cannot maintain the data by the accesses for writing/reading the data alone. Such cells thus require the refresh operation during a frame period.

Furthermore, the technique described in Patent Document 1 is not suitable to increase the operation frequency by utilizing the burst access capability of synchronous dynamic random access memories (SDRAMs). That is, SDRAMs are capable of operating at high frequencies by utilizing burst access capabilities in which a plurality of memory cells positioned at consecutive column addresses are successively accessed by only supplying a first one of the consecutive addresses. In the memory access technique describe in Patent Document 1, however, a plurality of memory cells positioned at the same column address are successively accessed by incrementing the row address. The column address is incremented only after the row address reaches the maximum row address. As a result, the burst access capabilities of SDRAMs cannot be utilized.

SUMMARY

An exemplary object of this invention is to provide memory accesses methods that make refresh operations of dynamic random accesses memories unnecessary while enabling increased operation frequency. Another exemplary object of this invention is to provide memory control circuits and memory systems that employ the memory access methods that make the refresh operations unnecessary.

Exemplary embodiments according to this disclosure provide a method of accessing a dynamic random access memory having memory cells arranged in an address space defined by row addresses and column addresses. The method includes setting an access area within the address space for storing data composed of a specified number of words by arranging two or more complete columns of blocks and, optionally, an incomplete column of blocks along a direction of the column addresses, and successively accessing the two or more complete columns of blocks and the optional incomplete column of blocks by successively accessing the blocks arranged in each of the columns of blocks to write and store data in the memory or to read data previously stored in the memory. Each of the blocks includes a plurality of memory cells positioned at a same row address and a specified number of consecutive column addresses, each of the complete columns of blocks including a first number of the blocks arranged in an entirety of a specified range of row addresses, the incomplete column of blocks includes less than the first number of the blocks arranged in a portion of the specified range of row addresses, and a total number of the blocks arranged in the two or more complete columns of blocks and in the optional incomplete column of blocks is just capable of storing the specified number of words. Further, the memory is a synchronous dynamic random access memory, the memory cells are required to be refreshed within a refresh period, and accessing one of the blocks positioned at each of the row addresses refreshes the memory cells included in other ones of the blocks positioned at the same row address.

According to various embodiments, the address space may be divided into n banks, where n is an integer not less than two. The setting of the access area may be performed such that two or more complete columns of blocks and an optional incomplete column of blocks are arranged along the direction of column addresses in each of the n banks, wherein the total number of the blocks is a sum of numbers of the blocks arranged in the n banks. Furthermore, successively accessing the blocks arranged in each of the columns of blocks may include successively accessing the blocks arranged in the n banks at each of the row addresses.

According to various embodiments, the specified range of row addresses may be narrower than a range of row addresses of the address space.

According to various embodiments, setting of the access area may include, when the specified number of words of the data is changed, changing the specified range of row addresses without changing the specified number of consecutive column addresses of each of the blocks.

According to various embodiments, the data may constitute one of successive frames of a moving image supplied within a frame period longer than the refresh period, and successively accessing the two or more complete columns of blocks and the optional incomplete column of blocks may be performed once within the frame period.

Exemplary embodiments according to this disclosure provide a method of accessing a dynamic random access memory having memory cells arranged in an address space divided into n banks, where n is an integer not less than two. The method includes setting an access area within the address space for storing data composed of a specified number of words by arranging a required number, which is not less than two, of complete columns of blocks and, optionally, an incomplete column of blocks along a direction of the column addresses in each of the n banks, and successively accessing the required number of complete columns of blocks and the optional incomplete column of blocks by successively accessing the blocks arranged in each column of blocks to write and store data in the memory or to read data previously stored in the memory. The specified range of row addresses is set by i) dividing a total number of blocks required to store the specified number of words by n and the required number of complete columns of blocks to obtain a quotient, and ii) setting the specified range of row address such that the specified range of row addresses includes a number of row addresses equal to an integer part of the quotient. Successively accessing the blocks arranged in each column of blocks includes successively accessing the blocks arranged in n banks at each of the row addresses. The memory is a synchronous dynamic random access memory, the memory cells are required to be refreshed within a refresh period, and accessing one of the blocks positioned at each of the row addresses in each of the banks refreshes the memory cells included in other ones of the blocks positioned at the same row address in the same bank.

Exemplary embodiments according to this disclosure provide a memory control circuit for controlling a dynamic random access memory having memory cells arranged in an address space. The circuit includes an access area setting unit that sets an access area within the address space for storing a data composed of a specified number of words by arranging two or more complete columns of blocks and, optionally, an incomplete column of blocks along a direction of the column addresses, and an access control unit that supplies an address signal and an access control signal to the memory such that the two or more complete columns of blocks and the optional incomplete column of blocks are successively accessed by successively accessing the blocks arranged in each of the columns of blocks to write and store data in the memory or to read data previously stored in the memory.

According to various embodiments, the address space of the memory may be divided into n banks, where n is an integer not less than two, and the access area setting unit may set the access area such that the two or more complete columns of blocks and the optional incomplete column of blocks are arranged along the direction of the column addresses in each of the n banks, wherein the total number of the blocks is a sum of numbers of the blocks arranged in the n banks. The access control unit may supply the address signal and the access control signal to the memory such that successively accessing the blocks arranged in each of the columns of blocks includes successively accessing the blocks arranged in the n banks at each of the row addresses.

According to various embodiments, the access area setting unit may include a row address range setting unit that sets the specified range of row addresses in accordance with the specified number of words of the data without changing the specified number of consecutive column addresses of each of the blocks. Further, the row address range setting unit may receive a data size signal that indicates the specified number of words.

According to various embodiments, the data may constitute one of successive frames of a moving image supplied within a frame period longer than the refresh period and the access control unit may supply the address signal and the access control signal such that the two or more complete columns of blocks and the optional incomplete column of blocks are accessed once within the frame period.

Exemplary embodiments according to this disclosure provide a memory control circuit for controlling a dynamic random access memory having memory cells arranged in an address space divided into n banks, where n is an integer not less than two. The circuit includes an access area setting unit that sets an access area within the address space for storing data composed of a specified number of words by arranging a required number, which is not less than two, of complete columns of blocks and, optionally, an incomplete column of blocks along a direction of column addresses in each of the n banks, and an access control unit that supplies an address signal and an access control signal to the memory such that the two or more complete columns of blocks and the optional incomplete column of blocks are successively accessed by successively accessing the blocks arranged in each of the columns of blocks to write and store data in the memory or to read data previously stored in the memory. The access area setting unit sets the specified range of row addresses by i) dividing a total number of blocks required to store the specified number of words by n and the required number of complete columns of blocks to obtain a quotient, and ii) setting the specified range of row addresses such that the specified range of row addresses includes a number of row addresses equal to an integer part of the quotient. The access control unit supplies the address signal and the access control signal to the memory such that successively accessing the blocks arranged in each of the columns of blocks includes successively accessing the blocks arranged in the n banks at each of the row addresses. The memory is a synchronous dynamic random access memory, the memory cells are required to be refreshed within a refresh period, and accessing one of the blocks positioned at each of the row addresses in each of the banks refreshes the memory cells included in other ones of the blocks positioned at the same row address in the same bank.

Exemplary embodiments according to this invention provide a memory system that includes a synchronous dynamic random accesses memory having memory cells arranged in an address space, an input terminal that receives data, which constitutes one of successive frames of a moving image within a frame period, and a memory control circuit for controlling the synchronous dynamic random access memory. The memory control circuit includes an access area setting unit that sets an access area within the address space for storing data composed of a specified number of words by arranging two or more complete columns of blocks and, optionally, an incomplete column of blocks along a direction of the column addresses, and an access control unit that supplies an address signal and an access control signal to the memory such that the two or more complete columns of blocks and the optional incomplete column of blocks are successively accessed once within the frame period by successively accessing the blocks arranged in each column of blocks to write and store data in the memory or to read data previously stored in the memory.

Exemplary embodiments according to this invention provide a memory system that includes a synchronous dynamic random accesses memory having memory cells arranged in an address space divided into n banks, where n is an integer not less than two, an input terminal that receives data, which constitutes one of successive frames of a moving image within a frame period, and a memory control circuit for controlling the dynamic random access memory. The memory control circuit includes an access area setting unit that sets an access area within the address space for storing data composed of a specified number of words by arranging a required number, which is not less than two, of complete columns of blocks and, optionally, an incomplete column of blocks along a direction of the column addresses in each of the n banks, and an access control unit that supplies an address signal and an access control signal to the memory such that the required number of complete columns of blocks and the optional incomplete column of blocks are successively accessed once within the frame period by successively accessing the blocks arranged in each of the columns of blocks to write and store data in the memory or to read data previously stored in the memory.

BRIEF DESCRIPTION OF THE DRAWINGS

Various exemplary details of cell libraries, methods of designing semiconductor integrated circuits, and semiconductor integrated circuits are described with reference to the following figures, wherein.

DETAILED DESCRIPTION

Figure 1:
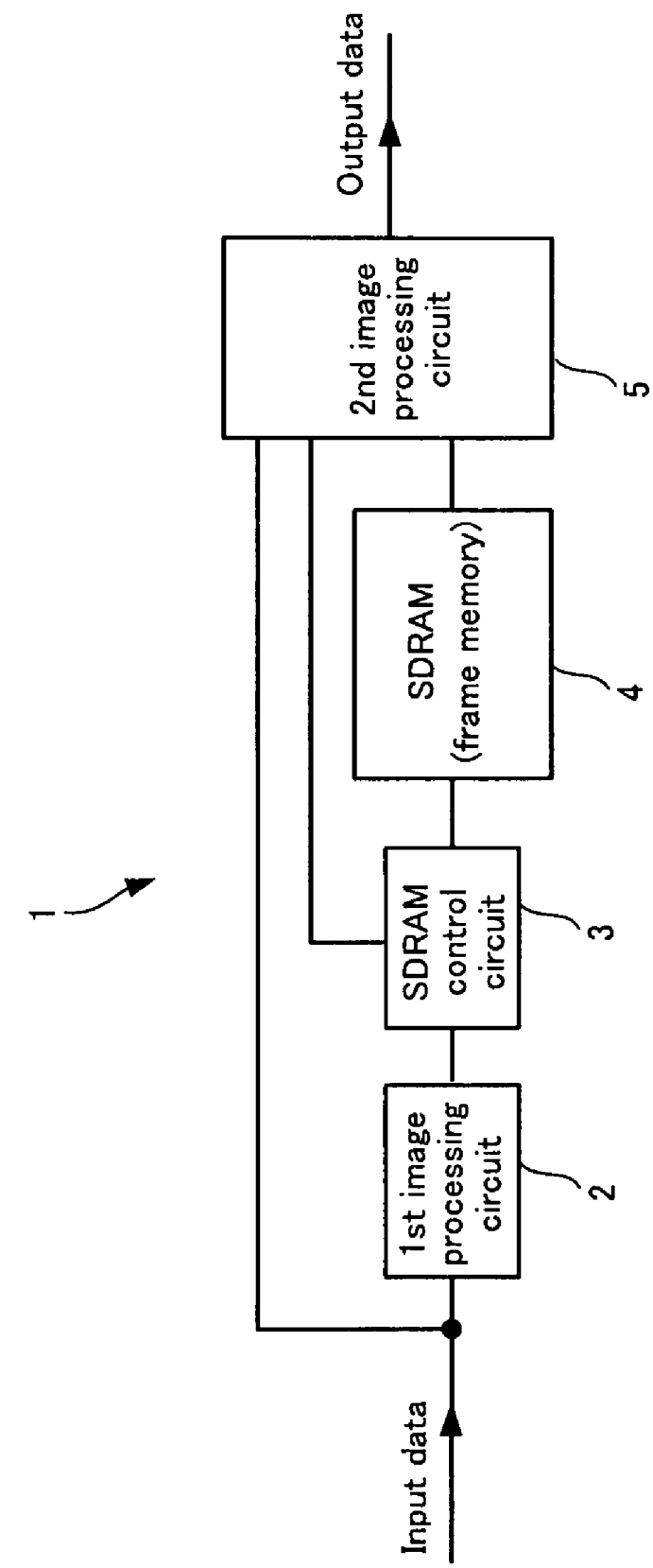
FIG. 1 is a block diagram that shows an exemplary semiconductor circuit.

FIG. 1 is a block diagram of an exemplary semiconductor circuit.

The exemplary semiconductor circuit 1 shown in FIG. 1 includes a first image processing circuit 2, SDRAM (Synchronous Dynamic Random Access Memory) control circuit 3, SDRAM 4, and a second image processing circuit 5. The SDRAM 4 is used as a frame memory. The semiconductor circuit 1 may be constructed as a single semiconductor integrated circuit integrating all of these blocks on a single semiconductor substrate. The semiconductor circuit 1 may also be constructed with the SDRAM 4 and a separate semiconductor integrated circuit that integrates all the blocks other than the SDRAM 4.

The first image processing circuit 2 performs processing such as color conversion processing of image data input from an external device, and outputs the processed image data to the SDRAM control circuit 3.

The SDRAM control circuit 3 performs control for storing of image data processed by the first image processing circuit 2 in the SDRAM 4.

The SDRAM 4 stores image data constituting one of successive frames of a moving image. In each frame period, the image data stored during the previous frame period is read from the SDRAM 4 and the image data of the current frame is stored in the SDRAM under the control of the SDRAM control circuit 3.

The second image processing circuit 5 compares image data input from the external device and image data read from the SDRAM 4 and performs image processing such as edge emphasizing. Then, the second image processing circuit 5 outputs image data (output data) to an external device that represents the image after the processing.

Figure 2:
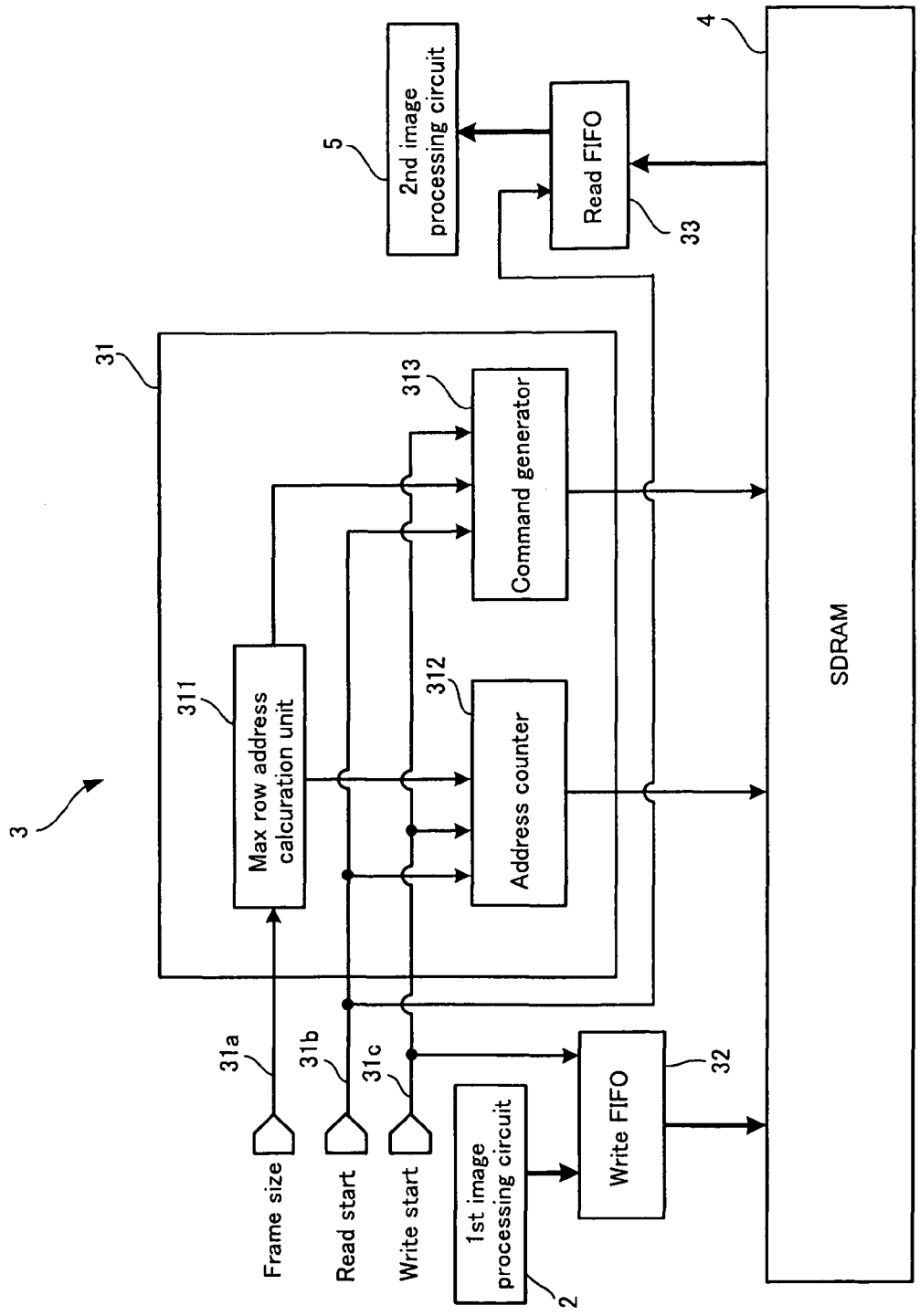
FIG. 2 is a schematic drawing that shows a construction of exemplary SDRAM control circuit.

FIG. 2 is a schematic drawing that shows a construction of an exemplary SDRAM control circuit 3. The exemplary SDRAM control circuit 3 shown in FIG. 2 includes a controller 31, a write FIFO (first-in, first-out memory) 32, and a read FIFO 33. The controller 31 includes a maximum row address calculation unit 311, an address counter unit 312, and a command generator unit 313. FIG. 2 also shows a SDRAM 4 controlled by the exemplary SDRAM control circuit 3. Thus, FIG. 2 also shows an exemplary memory system including the SDRAM 4 and the SDRAM control circuit 3. In operation, the SDRAM control circuit 3 receives a frame size signal from first signal line 31a, a read start signal from second signal line 31b, and a write start signal from third signal line 31c.

In operation, as explained above, reading of image data of the previous frame stored in the SDRAM 4 and storing of image data of the current frame into the SDRAM 4 are performed successively, under the control of the SDRAM control circuit 3, during the same frame period. In the following paragraphs, however, functions of the SDRAM control circuit 3 will be explained assuming that only the wiring of image data is performed.

Figure 3:
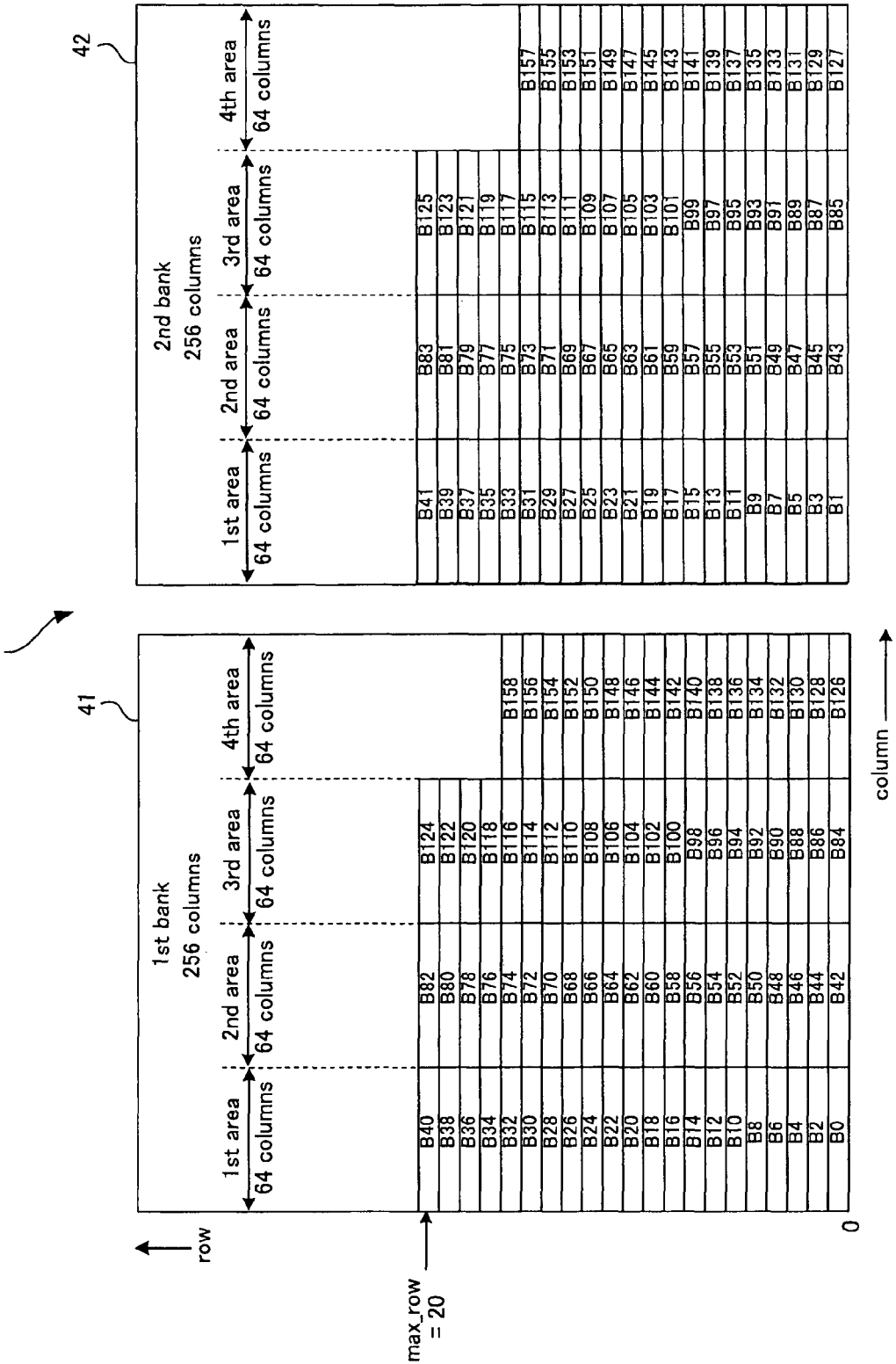
FIG. 3 is a schematic drawing that shows an exemplary setting of an access area within a SDRAM.

FIG. 3 is a schematic drawing that shows an exemplary setting of an access area within a SDRAM. The exemplary SDRAM 4 shown in FIG. 3 has an address space defined by row addresses in the vertical direction and column addresses in the horizontal direction. In the exemplary SDRAM 4 shown in FIG. 3, the address space is physically divided into the first bank 41 and the second bank 42. Each bank is logically divided into four areas each including 64 consecutive column addresses, i.e., the first area including column addresses 0 to 63, the second area including column addresses 64 to 127, the third area including column addresses 128 to 191, and the fourth area including column addresses 192 to 255.

FIG. 3 shows the state that an access area for storing the image data of each frame is set by arranging 159 blocks, numbered from B0 to B158, within the address space that is divided into two banks. A row address and a range of column addresses define each block. That is, each block includes a plurality of memory cells positioned at a same row address and a specified number of consecutive column addresses. Specifically, in the example shown in FIG. 3, each block includes memory cells positioned at a row address and 64 consecutive column addresses of one of the divided areas.

Each of the blocks includes a number of memory cells capable of storing 64 words of data. In other words, each block includes "the number of bits in each word"×64 memory cells. The image data of each frame includes a number of words that can be just capable of being stored using the 159 blocks. The numbers 0 to 158 given for each of the blocks represents the order of accessing the SDRAM 4 for storing the image data, which is divided into 159 blocks each including 64 words.

For example, the first 64 words of the image data of a frame are written into block B0, which is positioned at the row address of 0 within the first area of the first bank 41. The next 64 words of the image data are written into block B1, which is positioned at the row address of 0 within the first area of the second bank 42. The next 64 words of the image data are written into block B2, which is positioned at the row address of 1 within the first area of the first bank 41. The next 64 words of the image data are written into block B3, which is positioned at the row address of 1 within the first area of the second bank 2.

In this way, image data is successively written into blocks arranged in the first areas, while alternately changing the banks, with an order from the blocks positioned at the lowest row address to the blocks positioned at higher row addresses. When writing into block B41, which is positioned at the row address of 20 within the second bank, is completed, the next 64 words are written into block B42, which is positioned within the second area of the first bank 41. Then, image data is further written successively in the blocks arranged in the second areas of the first and the second banks in the same way.

As explained above, a plurality of blocks, each defined by a row address and 64 column addresses, are arranged in two banks, and image data each including 64 words are successively written into the plurality of blocks. The way of writing image data will be further explained with reference to FIGS. 2 and 3. Note that a refresh operation with a predefined period is required in the SDRAM 4 and that writing into or reading from a block at a row address in a bank has the same effect of refreshing the memory cells having the same row address in the same bank.

The controller 31 in the exemplary SDRAM control circuit 3 shown in FIG. 2 has a first signal line 31a, a second signal line 31b, and a third signal line 31c. A signal "Frame size" that indicates size of the image data of a frame, which is generated by a circuit not shown in drawing, is input to the first signal line 31a. A signal "Read start" that indicates start of reading the image data is input to the second signal line 31b. A signal "Write start" that indicates start of writing the image data is input to the third signal line 31c.

The signal input to the first signal line 31a is input to the maximum row address calculation unit 311, which calculates a maximum row address from the input signal. The maximum row address defines the specified range of row addresses in which the access area is set. FIG. 3 shows an example in which the row address of 20 is set as the maximum row address and the specified range of row addresses is set to the range 0 to 20. Here, the maximum row address of 20 is smaller that the maximum physical row address of the SDRAM 4. In other words, the specified range of row addresses of 0 to 20 is narrower than the range of row addresses of the address space, which is represented by the rectangle 41 or 42 in FIG. 3.

A complete column of blocks, in which the blocks are arranged in the entirety of the specified range of row addresses, is provided in each of the first to the third areas in each of the banks. In addition, an incomplete column of blocks, in which the blocks are arranged only in a portion of the specified range of row addresses, is provided in the fourth area in each of the banks.

According to exemplary memory access methods, two or more complete columns of blocks are arranged along the direction of column addresses in each of the banks. Additionally, an incomplete column of blocks may also be arranged in addition to the two or more complete columns of blocks in each of the banks. In the example shown in FIG. 3, for example, three complete columns of blocks and an incomplete column of blocks are arranged in each of the first bank 41 and the second bank 42.

In exemplary memory access methods, two or more complete columns of blocks are arranged along the direction of column addresses to set the access area. Thereby, a refresh operation imposed on the SDRAM 4 may be omitted. That is, when writing image data divided into a plurality of blocks each having 64 words, the blocks arranged in the complete column of blocks are successively accessed. Furthermore, two or more complete columns of blocks are successively accessed by successively accessing the blocks arranged in each of the complete columns of blocks.

As a result, each of the row addresses within the specified range is accessed with an interval shorter than a frame period even in the worst case. Accordingly, the data stored in the memory cells in the access area is maintained without performing a refresh operation even if the required refresh period is shorter than a frame period.

Image data is successively stored in the blocks in the first area in each of the banks by incrementing the row address. For example, after storing the data in the block B41 positioned at the maximum row address of 20 in the first area in the second bank 42, the next part of the data is stored in block B42 positioned at the row address of 0 in the second area in the first bank 41, and then in block B43 located at the row address of 0 in the second area in the second bank 42.

Storing image data in block B42 has the same effect as refreshing the memory cells included in block B0, in which image data of the same frame is stored. Storing image data in block B42 further has the same effect as refreshing the memory cells included in block B84 in the third area and block B126 in the fourth area, in which image data of the previous frame was stored. Also, storing image data in block B43 has the same effect as refreshing the memory cells include in block B1, in which image data of the same frame has been stored, and memory cells included in block B85 in the third area and block B127 in the fourth area, in which image data of the previous frame was stored.

Assume that a period equal to a frame period is required for storing image data in block B0 through block B158. Then, when four columns of blocks are arranged in each bank as shown in FIG. 3, the interval from storing image data in the first block B0 in the first column of blocks to storing image data in the first block B42 in the next column of blocks is about ¼ of the frame period. The interval from storing image data in block B1 to storing image data in block B43 is the same. Blocks B0 and B1 are effectively refreshed with this internal. In the following explanation, this interval is designated as "interval A".

Similarly, storing image data in blocks B44 through B83 has the same effect of refreshing memory cells included in each of blocks B2 through B41, each of blocks B86 through B125, and each of blocks B128 through 158 with the same interval A. Storing image data in blocks B84 through B125 arranged in the complete columns of blocks in the third area has the same effect of refreshing memory cells including in each of blocks B0 through B83 and in each of blocks B128 through B158 with the same interval A.

Furthermore, storing image data in blocks B126 through B158 arranged in the incomplete column of blocks in the fourth area has the same effect of refreshing memory cells included in each of blocks B0 through B32, each of blocks B42 through B74, and each of blocks B84 through B116 with the same interval A.

For blocks B34 to B40 in the first area, blocks B76 to B82 in the second area, or blocks B118 to B124 in the third area of the first bank, there are no corresponding blocks having the same row addresses in the incomplete column of blocks in the fourth area. Accordingly, memory cells included in these blocks arranged in the first to the third areas in the first bank are not refreshed when storing image data into the incomplete column of blocks arranged in the fourth area.

After image data is stored in blocks in the incomplete column of blocks, the row addresses for which blocks are not arranged in the fourth area are next accessed when image data is written into the blocks arranged in the first area at the same row addresses during the next frame period. Accordingly, assuming that a frame period is required to store image data in all the blocks constituting the access area, the memory cells included in the blocks at the row addresses at which the blocks are not arranged in the incomplete columns of blocks are refreshed by the accesses to the same row addresses with a period of, at maximum, about $2/4=1/2$ of the frame period.

This period is still shorter than the frame period. Accordingly, even if the refresh period required for maintaining stored data becomes shorter than the frame period, it is not necessary to perform a refresh operation, provided the required refresh period is within a range comparable to the frame period. The situation is the same for blocks B33 to B41 in the first area, blocks B75 to B83 in the second area, and blocks B117 to B125 in the third area in the second bank. That is, memory cells included in these blocks are refreshed by the accesses to the same row addresses with a period of about $1/2$ of the frame period, even in the worst case. Accordingly, a refresh operation is not needed.

The signal indicating the maximum row address calculated in the maximum row address calculation unit 311 is sent to the address counter unit 312 and to the command generator unit 313. A signal "Read start" indicating start of reading image data and sending the read data to the second image processing circuit 5, input to the second signal line 31b, is sent to the address counter unit 312, the command generator unit 313, and the Read FIFO 33. A signal "Write start" indicating start of writing image data input from the first image processing circuit 2, input to the third signal line 31c, is sent to the address counter unit 312, command generator unit 313, and the Write FIFO 32.

As described in, for example, U.S. Pat. No. 7,023,413, which is hereby incorporated by reference in its entirety, writing and reading data through respective FIFOs enables use of a DRAM as a frame memory.

A vertical synchronization signal that indicates start of a frame, and a clock signal, which are not shown in FIG. 2, are also input to the address counter unit 312. A counter register that counts the number of the clock signal, also not shown in FIG. 2, is provided within the address counter unit 312. The address counter unit 312 generates an address signal in accordance with the count value of the counter register and sends the generated address signal to the SDRAM 4.

Referring to the count value of the counter register, the command generator unit 313 generates access command signals such as bank active, write, and read command signals, and sends the generated access command signals to the SDRAM 4. The SDRAM 4 determines if the address signal received from the address counter unit 312 indicates the bank address, the row address, or the column address, referring to the access command signal simultaneously received with the address signal. Accordingly, the address specified by the address signal and the access command signal is accessed.

Figure 4:
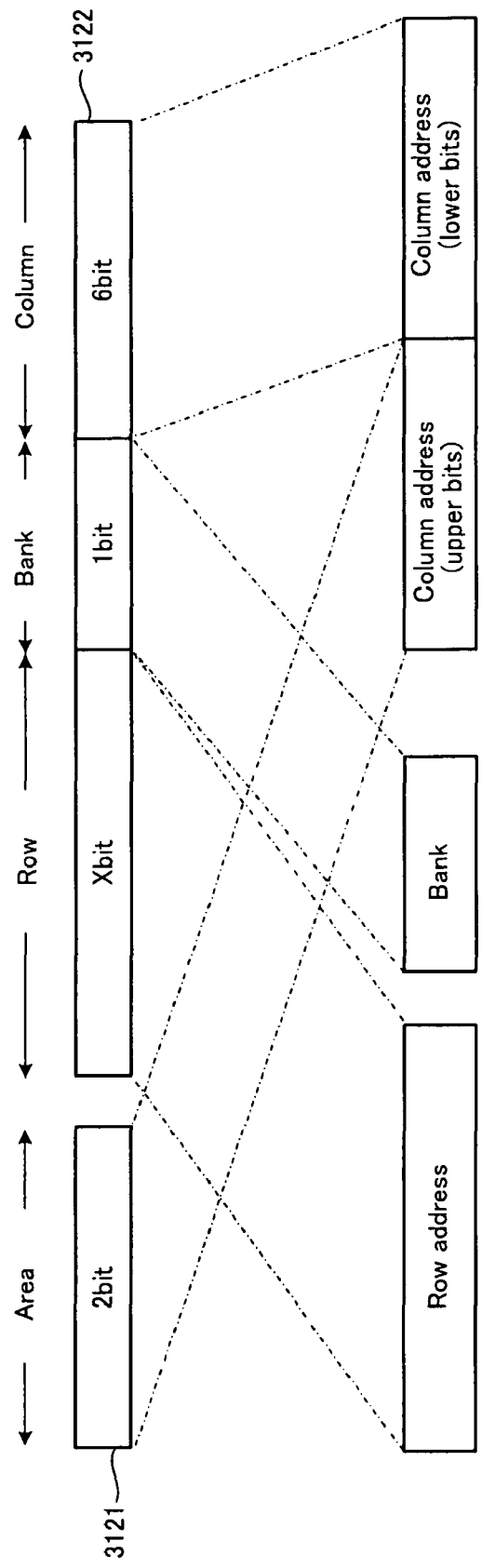
FIG. 4 is a schematic drawing that shows the internal construction of an exemplary counter register.

FIG. 4 is a schematic drawing that shows an internal construction of an exemplary counter register. The upper part of FIG. 4 shows the first counter register 3121 provided in the address counter unit 312, and the second counter register 3122 that counts the clock signal input to the address counter unit 312. The lower part of FIG. 4 shows how the count values of these two counter registers are combined to generate the bank, row, and column addresses of the SDRAM 4.

When the address counter unit 312 receives the vertical synchronization signal, which is not shown in FIG. 2, and detects start of a frame, the first counter register 3121 and the second counter register 3122 are reset to zero. Thereafter, when the "Write start" signal is received, the second counter register 3122 starts to count the clock signal. The lower six bits of the count value of the second counter register 3122 represent the lower six bits (0 to 63) of the column address. The 2-bit count value of the first counter register 3121 represents the upper 2 bits of the column address. The upper 2 bits of the column address change between 0 to 3 and represent the first area to the fourth area.

The next bit of the count value of the second counter register higher than the lower six bits represents the bank. The remaining upper X bits of the count value of the second counter register represent the row address.

Figure 5:
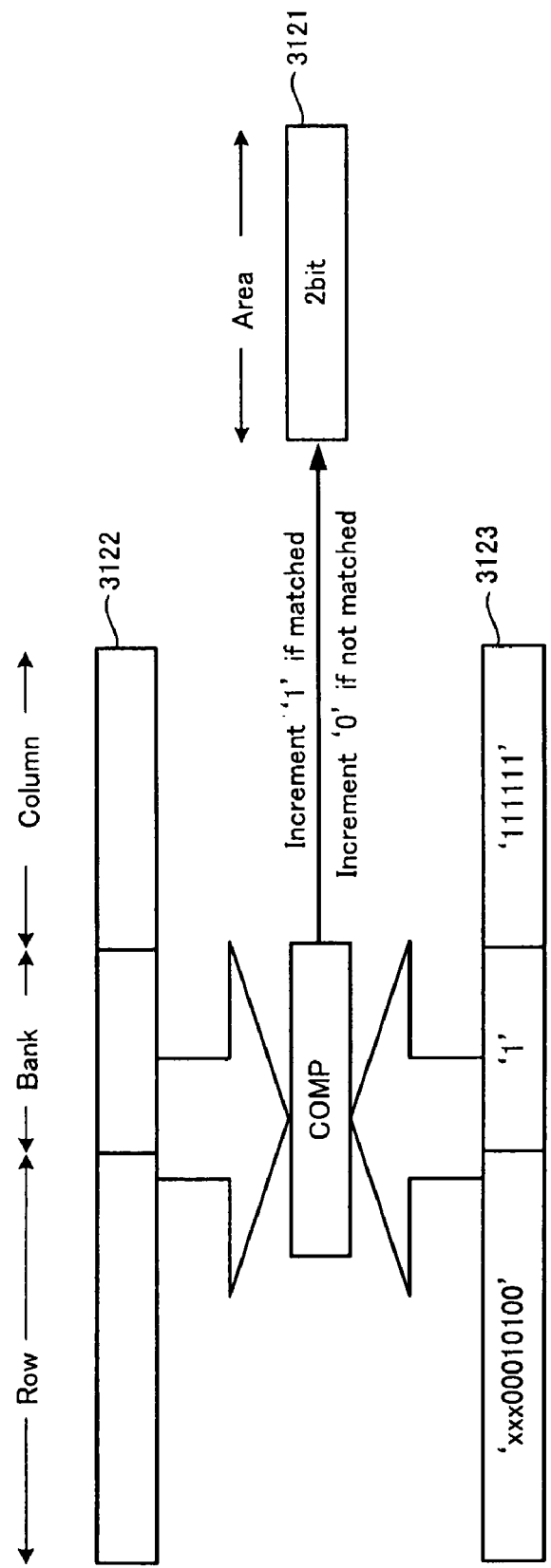
FIG. 5 is a schematic drawing that explains an exemplary counting-up operation of the first counter register.

FIG. 5 is a schematic drawing that explains an exemplary counting-up operation of the first counter register. As shown in FIG. 5, the address counter 312 includes, in addition to the first counter register 3121 and the second counter register 3122, a reference value register 3123 that stores a reference value. The lower six bits of the reference value register store a value "111111", and the next upper bit thereof stores "1". Further the upper bits of the reference value register store a value "xxx0010100" that represents the maximum row address 20 calculated by the maximum row address calculation unit 311.

The address counter 312 continuously compares the count value of the second counter register 3122 and the reference value stored in the reference value register 3123. When these values match, the address counter increments the 2-bit count value of the first counter register 3121 by one, and resets the count value of the second counter register 3122 to zero.

Referring again to FIG. 2, when the external signal "Write start" is input, image data is written into the SDRAM 4 through the Write FIFO 32. In order to write the data into the SDRAM 4, the address counter unit 312 generates the address signal and sends the generated address signal to SDRAM 4. Accordingly, image data constituting a frame is written into the 159 blocks shown in FIG. 3 during a frame period.

In practice, only the first one of the column addresses within each block is supplied from the address counter unit 312 to the SDRAM 4. By utilizing the burst accessing capability of the SDRAM 4, the following column addresses within each block are successively accessed. Thus, the operation frequency of the memory system may be increased. Nonetheless, the second counter register 3122 continues to count the clock signal while accessing the following column addresses within the block, in order to generate the address of the next block.

As explained above, the maximum row address calculated by the maximum row address calculation unit 311 is stored in the upper bits of the reference register 3123. The address counter unit 312 and the command generator unit 313 generate the address signal and the access command signal, and the generated address signal and access command signal are sent to the SDRAM 4. Thereby, image data constituting a frame is stored in the access areas set within the address space of the SDRAM 4.

In practice, as explained above, reading of the image data constituting the previous frame and writing of the image data constituting the present frame are conducted within the same frame period. Accordingly, access to the row addresses within the specified range of row addresses is performed with a higher frequency that the case explained above, i.e., the case that only the writing is performed.

However, a read/write sequence in which, after reading from a certain number of blocks in the first bank 41 and from the corresponding blocks in the second bank 42, the same blocks are accessed again to write data therein may be employed in order to minimize the required memory capacities of Write FIFO 32 and Read FIFO 33. For example, after accessing a certain number of blocks to read the image data constituting a line within the previous frame, the same blocks are accessed again to write the image data constituting the corresponding line within the present frame. In this case, the maximum interval between successive accesses to a row address is approximately the same as in the case explained above.

In order to perform the reading and writing of image data during each frame period, in practice, respective ones of the first counter register 3121, second counter register 3122, reference register 3123, and the comparator are provided for generating read addresses and write addresses in the address counter unit 312.

As explained above, the exemplary SDRAM control circuit 3 utilizes the characteristic of the SDRAM 4 that accessing a block positioned at a row address in a bank provides the same effect as refreshing the memory cells included in the same block and in the other blocks having the same row address in the same bank. Thereby, it enables stored data to be maintained merely by accessing the access area for writing and/or reading data without performing the refresh operation.

That is, in accordance with the number of words of the image data to be stored, a specified range of row addresses within which the access area is set is determined. Two or more complete columns of blocks, in which the blocks are arranged in the entirety of the specified range of row addresses, are arranged along the direction of column addresses in each of the banks. As a result, each of the row addresses within the specified range is accessed with an interval shorter than the frame period by writing data in or reading data from the access area.

More specifically, in the example shown in FIG. 3, the access area is set by arranging three complete columns of blocks and an incomplete column of blocks in each of the banks. In this case, when a frame period is required to write or read image data that constitutes a frame, each of the row addresses of the block included in the incomplete column of blocks is accessed with an interval of about ¼ of the frame period. Accordingly, the memory cells in the blocks at these row addresses are effectively refreshed with the interval of about ¼ of the frame period. The interval of accessing each of the row addresses of the blocks not included in the incomplete column of blocks is about ½ of the frame period, even in the worst case. Thus, the memory cells in the blocks at these row addresses are effectively refreshed with the interval of shorter than about ½ of the frame period.

In practice, a preparation period is required to access memory cells of the SDRAM 4 in different rows. Accordingly, if image data is written into the blocks in the same bank while incrementing the row address, a wait is required between successive accesses and a longer total period is required to store the entire data. Accordingly, the exemplary SDRAM control circuit 3 arranges the blocks in two banks, and writes the data by alternately accessing the blocks arranged in different banks.

That is, after writing a part of the data into a block at a certain row address in a first bank 41, the next part of the data is written into the block at the same row address in the second bank 42. While writing the data into the block at the certain row address in the second bank 42, the row address one higher in the order of row addresses from the certain row address is activated so that no wait is required for accessing the block in the first bank. The same sequence is also employed in reading the data from the SDRAM 4.

In order to alternately access the blocks in different banks with no wait, the command generator unit 313 generates, while accessing a block in one of the banks, a bank active command, and sends the generated command to the SDRAM 4. Simultaneously, the address counter unit 312 generates an address signal that specifies the block to be accessed next, and sends the generated address signal to the SDRAM 4. The address counter unit 312 generates the address signal in accordance with the count value of the second counter register 3122. However, an adjustment of the address is needed because the count values of the counter registers corresponds to the address within the block that is being accessed now.

Accessing SDRAM divided into a plurality of banks is disclosed in, for example, Japanese laid-open patent 2000-315386, which is hereby incorporated by reference in its entirety. It is preferable to use a SDRAM having an address space divided into a plurality of banks so that no wait is required between successive accesses. Thereby, the total period to read or write the data can be shortened. However, it is not indispensable to use a SDRAM having an address space divided into a plurality of banks.

Figure 6:
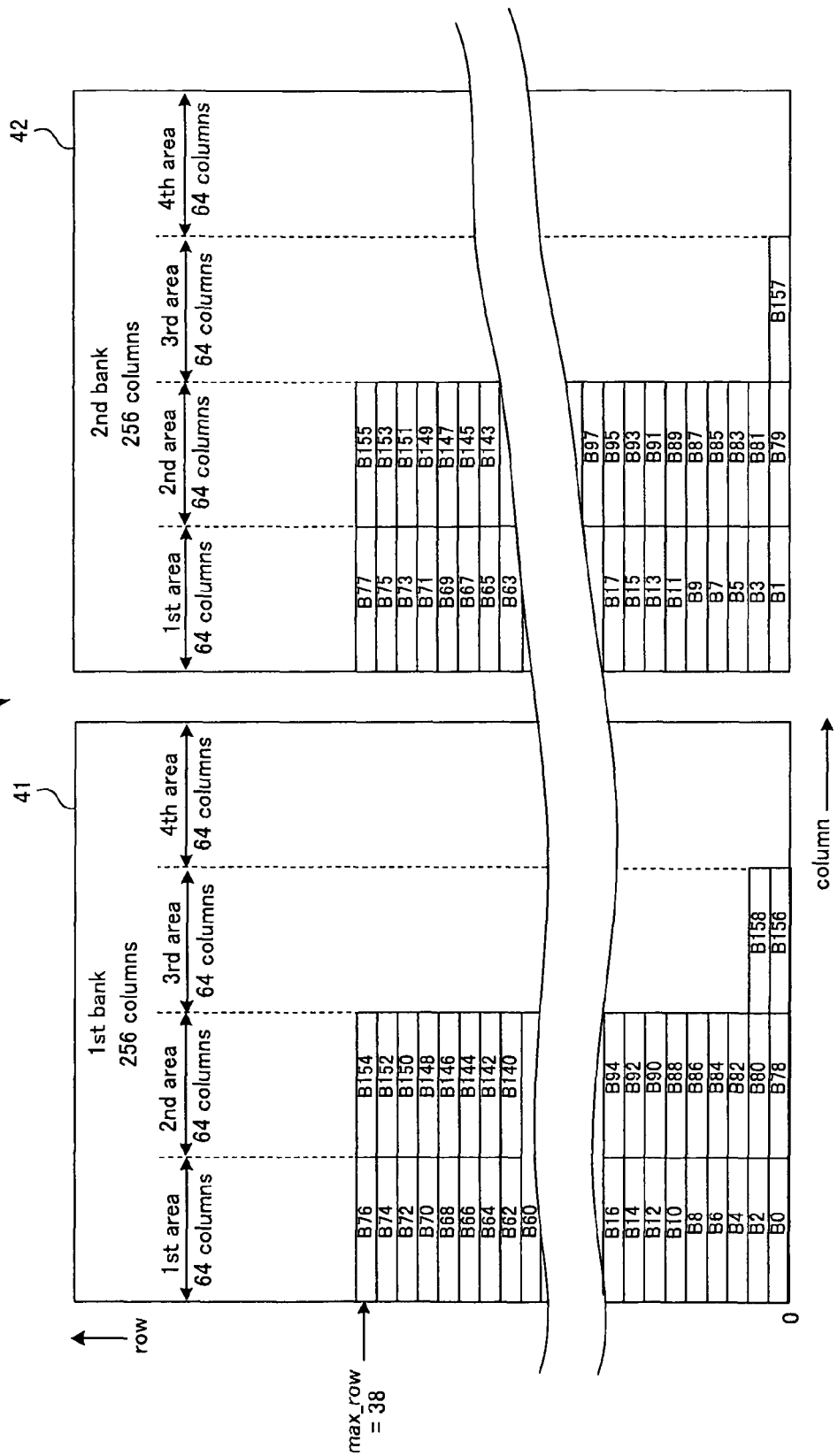
FIG. 6 is a schematic drawing that shows another exemplary setting of an access area within a SDRAM.

FIG. 6 is a schematic drawing that shows another exemplary setting of an access area within a SDRAM. FIG. 6 shows an example that two complete columns of blocks and an incomplete column of blocks are arranged in each of two banks. The number of column addresses within each block is 64, which is same as the case shown in FIG. 3. The number of blocks required to store the image data constituting a frame is 159 (blocks 0 to 158), and the specified range of row addresses is set to 0 to 38. That is, the maximum row address is set to 38.

The specified range of row addresses is set so that two complete columns of blocks are arranged in each of two banks. Specifically, the number of blocks required to store the image data constituting a frame (159) is divided by the number of banks (2) and further by the number of complete columns of blocks (2) to be arranged in each of the banks. The maximum row address may be set as the integer part of the quotient (39) minus 1. The row addresses between 0 to the maximum row address, which includes a number of row addresses equal to the quotient (39), may be set as the specified range of row addresses.

The specified range of row addresses may be set from a different row address within the address space such that the specified range of row addresses includes a number of row addresses equal to the maximum row address plus 1, i.e., the integer part of the quotient.

In the exemplary block construction shown in FIG. 6, an incomplete column of blocks is arranged in the third area. However, the number of blocks arranged in the incomplete column of blocks is far smaller than the number of blocks arranged in the complete column of blocks. Accordingly, when a frame period is needed to access the entire access area, the interval of access to each of the row addresses within the specified range of row addresses, including the row addresses of the blocks not arranged in the incomplete column of blocks, is about the half of the frame period. Accordingly, the refresh operation is not required.

When the incomplete column of blocks includes blocks arranged in almost the entirety of the specified range of row addresses, the maximum interval of accessing the row addresses of the blocks not arranged in the incomplete column of blocks is about ⅔ of the frame period. The access interval is still shorter than the frame period. Accordingly, the refresh operation is not required when the refresh period is shorter than but comparable to the frame period.

In the exemplary block construction shown in FIG. 6, the specified range of row addresses is set to be 0 to the maximum row address, which is equal to the number of blocks in each of the complete columns of blocks minus 1. In this case, the maximum row address may be set by i) dividing a total number of the blocks required to store the data constituting a frame by the number of banks and by the number of complete columns of blocks to be arranged in each of the banks, and ii) subtracting 1 from the integer part of the quotient. As a result, the maximum interval of accessing each of the row addresses within the specified range of row addresses may be made shorter than the frame period.

If the refresh period is far shorter than the frame period, it is possible to set the access area as shown in, for example, FIG. 3. That is, the number of complete columns of blocks to be arranged in each of the banks is increased and the specified range of row addresses is accordingly narrowed.

According to various embodiments, the maximum row address may be calculated according to the number of words included in the data to be stored, the number of banks, and the number of complete columns of blocks to be arranged in each of the banks. Storing the calculated maximum row address in the upper bits of the reference register 3123 may set the access area. The maximum row address may be calculated externally and input to the reference register 3123. Thereby, it is also possible to set the access area without providing the maximum row address calculation unit 311 in the controller 31.

As shown in FIG. 2, the controller 31 according to an exemplary embodiment may include three physical units, i.e., the maximum row address calculation unit 311, the address counter unit 312, and the command generator unit 313. As explained above, the controller 31 generates an address signal and an access command signal suitable for the construction of the access area such as shown in FIGS. 3 and 6, and sends the generated address and access command signals to the SDRAM 4. In other words, the controller 31 sets the access area of the SDRAM 4 and generates and sends the address and access command signals suitable for the access area set in the SDRAM 4.

Figure 7:
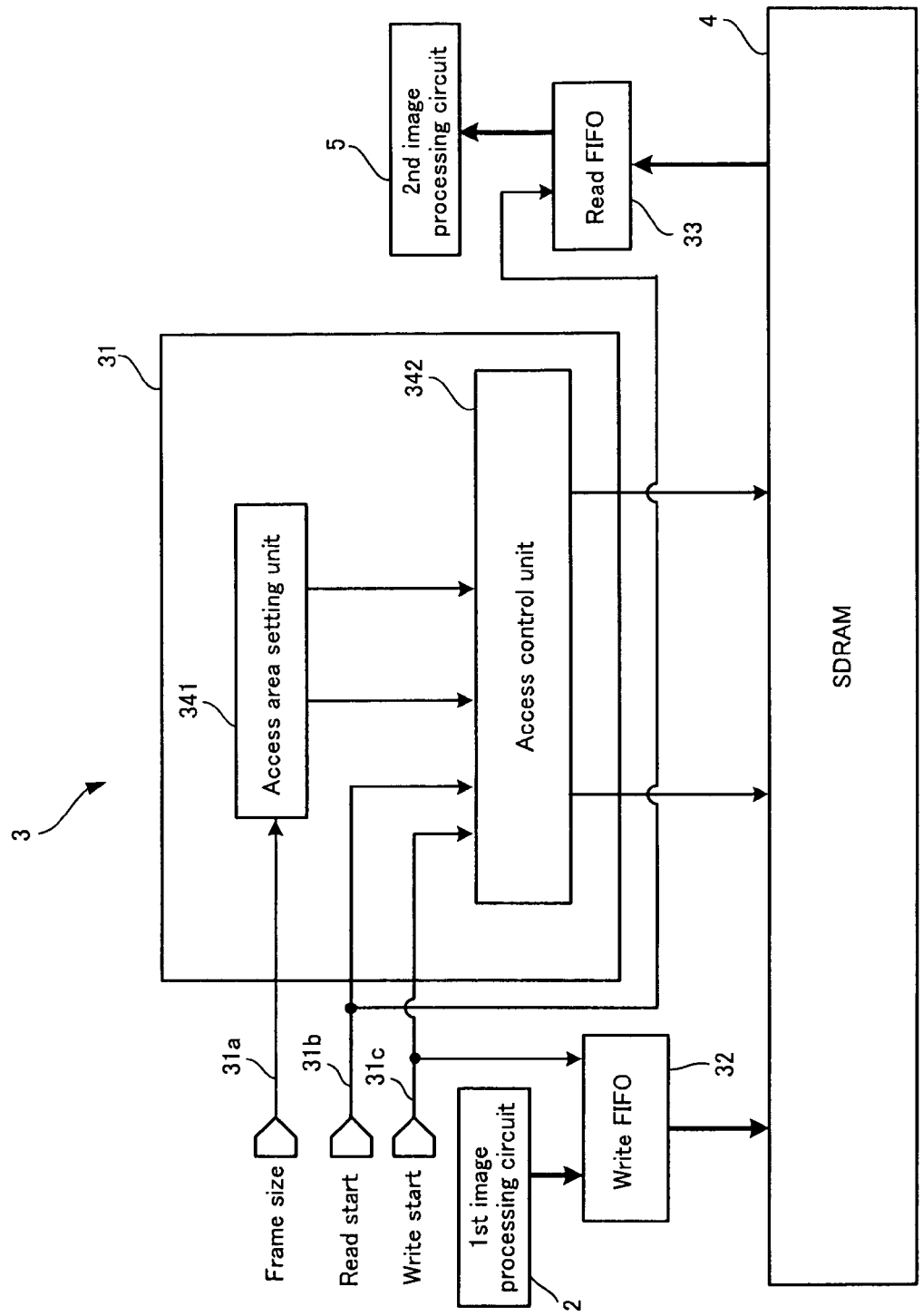
FIG. 7 is a schematic drawing that shows a functional construction of an exemplary SDRAM control circuit.

Accordingly, as shown in FIG. 7, it can be considered that the controller 31 includes two functional units, i.e., an access area setting unit 341 that sets the access area within the address space of the SDRAM 4, and a access control unit 342 that generates the address and access command signals. That is, FIG. 7 is a schematic drawing that shows a functional construction of an exemplary SDRAM control circuit 3. According to an exemplary embodiment, the correspondence between the address and the count values of the first and the second counter registers 3121 and 3122 shown in FIG. 4, and the maximum row address stored in the reference register 3123 set the access area.

Specifically, the number of lower bits of the second counter register 3122 used to represent the lower bits of the column address determines the number of column addresses within a block. The number of the bit of the second counter register 3122 used to represent the bank address determines the number of banks within which the columns of blocks are arranged. The maximum row address calculated by the maximum row address calculation unit 311 and stored in the reference register 3123 determines the specified range of row addresses within which the blocks are arranged. Finally, the relationship between the number of words included in the data to be stored and the number of column addresses within a block, the number of banks, and the specified range of row addresses determines the number of complete columns of blocks arranged in each of the banks and the number of blocks arranged within the incomplete column of blocks.

Thus, among the three units 311-313 shown in FIG. 2, the address counter unit 312 and the maximum row address calculation unit 311 may be considered to constitute the access area setting unit 341. On the other hand, the address counter unit 312 and the command generator unit 313 may be considered to constitute the access control unit 342.

Figure 8:
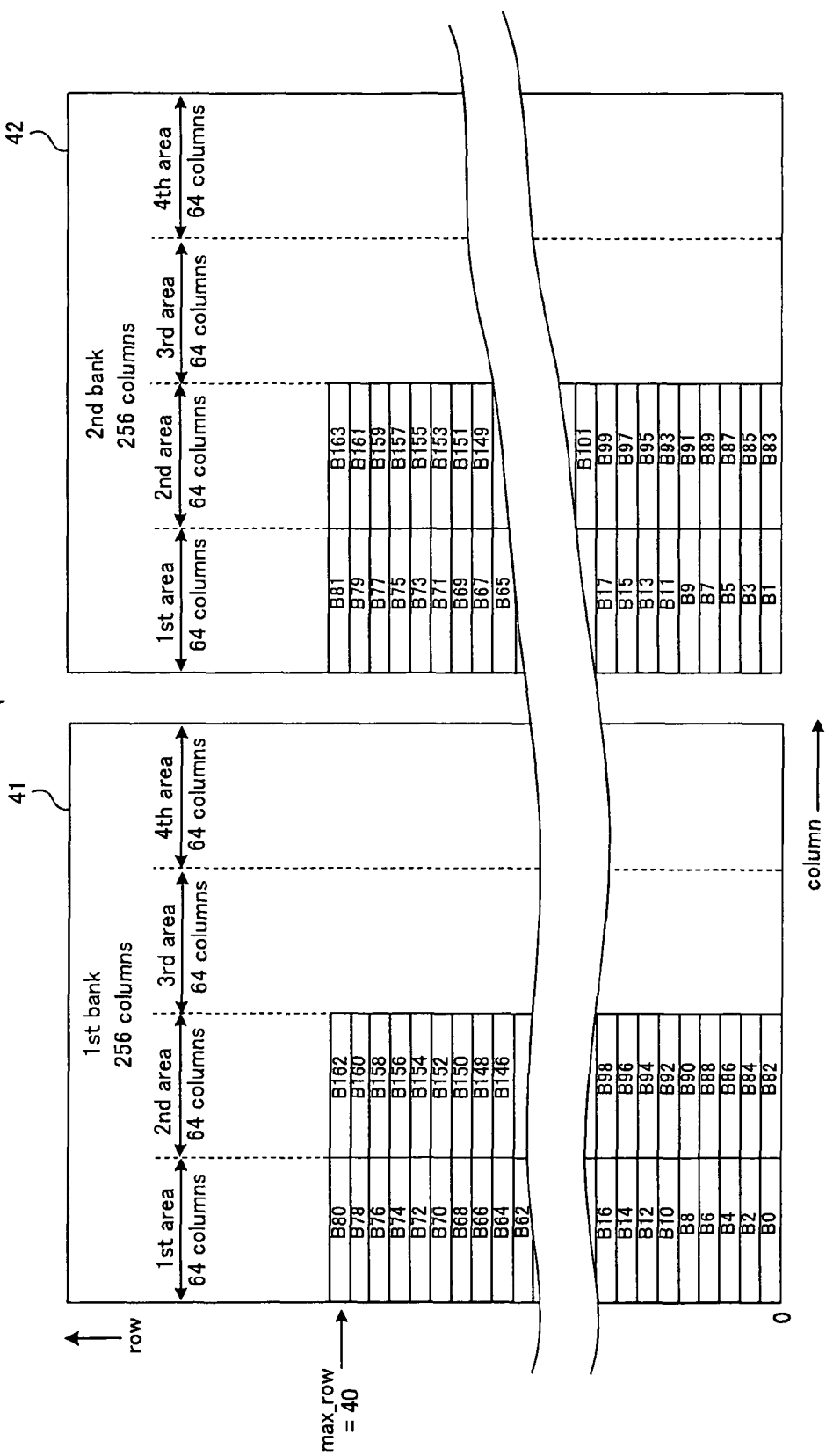
FIG. 8 is a schematic drawing that shows still another exemplary setting of an access area within a SDRAM.

FIG. 8 is a schematic drawing that shows still another exemplary setting of an access area within a SDRAM.

In the exemplary embodiment shown in FIG. 8, the number of words in the data constituting a frame is larger than in the exemplary embodiments shown in FIGS. 3 and 6. When the number of words in the data to be stored in the memory is changed, the access area is preferably set by changing the arrangement of the blocks without changing the number of words capable to be stored in a block, or the number of column addresses within a block. That is, it is preferable to change the specified range of row addresses in accordance with the change in the number of blocks required to store the data.

In practice, FIG. 8 shows an exemplary embodiment in which the number of column addresses in each of the blocks is 64, which is the same as in the embodiments shown in FIGS. 3 and 6, and in which 164 blocks are required to store the image data constituting a frame. In order to arrange at least two complete columns of blocks in each of the two banks, the maximum row address is set to 40, or the range of row addresses is set to be the range of 0 to 40. That is, same as the exemplary embodiment shown in FIG. 6, the required number of blocks (164) is divided by the number of banks (2) and the number of complete columns of blocks (2) to be arranged in each of the banks. The integer part of the quotient (41) minus 1 is set to be the maximum row address.

In the exemplary embodiment shown in FIG. 8, two complete columns of blocks and no incomplete column of blocks are arranged in each of the banks. In this exemplary embodiment, the interval for accessing is essentially the same as the interval in the exemplary embodiment shown in FIG. 6. That is, when a frame period is needed to access the entire access area, the interval of accessing each of the row addresses within the specified range of row addresses is about ½ of the frame period. As a result, the refresh operation is not required.

Further, in the exemplary embodiment shown in FIG. 8, the number of column addresses in each of the blocks is unchanged although the number of words of the data to be stored in the SDRAM is changed. Accordingly, only changing the value representing the maximum row address stored in the upper bits of the reference register 3123 enables use of the same controller 31.

The exemplary memory access methods, exemplary memory control circuits, and exemplary memory systems according to this invention have been explained in detail with reference to specific examples. However, this invention is not limited to the specific examples described above. This invention may accept various improvements and modifications within the spirit of the invention.

What is claimed is:

1. A method of accessing a dynamic random access memory having memory cells arranged in an address space defined by row addresses and column addresses, the method comprising:
    setting an access area within the address space for storing data, which constitutes one of successive frames of a moving image supplied within a frame period, by arranging two or more complete columns of blocks along a direction of the column addresses, wherein:

each of the blocks includes a plurality of the memory cells positioned at a same row address and a specified number of consecutive column addresses, and each of the complete columns of blocks includes a first number of the blocks arranged in an entirety of a specified range of row addresses; and successively accessing the two or more complete columns of blocks within the frame period by successively accessing the blocks arranged in each of the complete columns of blocks, wherein:

the memory is a synchronous random access memory, the memory cells are required to be refreshed within a refresh period, and accessing one of the blocks positioned at each of the row addresses refreshes the memory cells included in other ones of the blocks positioned at the same row address.

2. The method according to claim 1, wherein:

the address space is divided into n banks, where n is an integer not less than two;

the setting of the access area is performed such that the two or more complete columns of blocks are arranged along the direction of the column addresses in each of the n banks; and the successively accessing the blocks arranged in each of the complete columns of blocks includes successively accessing the blocks arranged in the n banks at each of the row addresses.

3. The method according to claim 2, wherein:

the specified range of row addresses is set by i) dividing the total number of the blocks by n and a number of the complete columns of blocks to obtain a quotient, and ii) setting the specified range of row addresses such that the specified range of row addresses includes a number of row addresses equal to an integer part of the quotient.

4. The method according to claim 3, wherein:

the arranging of the two or more complete columns of blocks further arranges an incomplete column of blocks along the direction of the column addresses, the incomplete column of blocks includes less than the first number of the blocks arranged in a portion of the specified range of row addresses; and the successively accessing of the two or more complete columns of blocks further successively accesses the incomplete column of blocks within the frame period.

5. The method according to claim 1, wherein the specified range of row addresses is narrower than a range of row addresses of the address space.

6. The method according to claim 1, wherein:

the data is composed of a specified number of words; and the setting of the access area includes, when the specified number of words of the data is changed, changing the specified range of row addresses without changing the specified number of consecutive column addresses of each of the blocks.

7. The method according to claim 1, wherein:

the arranging of the two or more complete columns of blocks further arranges an incomplete column of blocks along the direction of the column addresses, the incomplete column of blocks includes less than the first number of the blocks arranged in a portion of the specified range of row addresses; and the successively accessing of the two or more complete columns of blocks further successively accesses the incomplete column of blocks within the frame period.

8. A memory control circuit for controlling a dynamic random access memory having memory cells arranged in an address space defined by row addresses and column addresses, the circuit comprising:

an access area setting unit that sets an access area within the address space for storing data, which constitutes one of successive frames of a moving image supplied within a frame period, by arranging two or more complete columns of blocks along a direction of the column addresses, wherein:

each of the blocks includes a plurality of the memory cells positioned at a same row address and a specified number of consecutive column addresses, and each of the complete columns of blocks includes a first number of the blocks arranged in an entirety of a specified range of row addresses; and an access control unit that supplies an address signal and an access control signal to the memory such that the two or more complete columns of blocks are successively accessed within the frame period by successively accessing the blocks arranged in each of the complete columns of blocks, wherein:

the memory is a synchronous dynamic random access memory, the memory cells are required to be refreshed within a refresh period, and accessing one of the blocks positioned at each of the row addresses refreshes the memory cells included in other ones of the blocks positioned at the same row address.

9. The circuit according to claim 8, wherein:

the address space of the memory is divided into n banks, where n is an integer not less than two;

the access area setting unit sets the access area such that the two or more complete columns of blocks are arranged along the direction of the column addresses in each of the n banks; and the access control unit supplies the address signal and the access control signal to the memory such that the successively accessing the blocks arranged in each of the complete columns of blocks includes successively accessing the blocks arranged in the n banks at each of the row addresses.

10. The circuit according to claim 9, wherein:

the access area setting unit sets the specified range of row addresses by i) dividing the total number of the blocks by n and a number of the complete columns of blocks to obtain a quotient, and ii) setting the specified range of row addresses such that the specified range of row addresses includes a number of row addresses equal to an integer part of the quotient.

11. The method according to claim 10, wherein:

the access area setting unit further arranges an incomplete column of blocks along the direction of the column addresses, the incomplete column of blocks includes less than the first number of the blocks arranged in a portion of the specified range of row addresses: and the access control unit supplies the addresses signal and the access control signal to the memory such that the two or more complete columns of blocks and the incomplete column of blocks are successively accessed within the frame period.

12. The circuit according to claim 8, wherein the specified range of row addresses is narrower than a range of row addresses of the address space.

13. The circuit according to claim 8, wherein:

the data is composed of a specified number of words; and the access area setting unit includes a row address range setting unit that sets the specified range of row addresses in accordance with the specified number of words of the data without changing the specified number of consecutive column addresses of each of the blocks.

14. The circuit according to claim 13, wherein the row address range setting unit receives a data size signal that indicates the specified number of words.

15. The method according to claim 8, wherein:
the access area setting unit further arranges an incomplete column of blocks along the direction of the column addresses, the incomplete column of blocks includes less than the first number of the blocks arranged in a portion of the specified range of row addresses; and
the access control unit supplies the address signal and the access control signal to the memory such that the two or more complete columns of blocks and the incomplete column of blocks are successively accessed within the frame period.

16. A memory system comprising:
a synchronous dynamic random accesses memory having memory cells arranged in an address space defined by row addresses and column addresses;
an input terminal that receives data, which constitutes one of successive frames of a moving image, within a frame period; and
a memory control circuit for controlling the synchronous dynamic random access memory including:
an access area setting unit that sets an access area within the address space for storing the data by arranging two or more complete columns of blocks along a direction of the column addresses, wherein:
each of the blocks includes a plurality of the memory cells positioned at a same row address and a specified number of consecutive column addresses, and
each of the complete columns of blocks includes a first number of the blocks arrange in an entirety of a specified range of row addresses; and
an access control unit that supplies an address signal and an access control signal to the memory such that the two or more complete columns of blocks are successively accessed within the frame period by successively accessing the blocks arranged in each of the complete columns of blocks, wherein:
the memory cells are required to be refreshed within a refresh period, and
accessing one of the blocks positioned at each of the row addresses refreshes the memory cells included in other ones of the blocks positioned at the same row address.

17. The memory system according to claim 16, wherein:
the address space is divided into n banks, where n is an integer not less than two;
the access area setting unit sets the access area such that the two or more complete columns of blocks are arranged along the direction of the column addresses in each of the n banks; and
the access control unit supplies the address signal and the access control signal to the memory such that the successively accessing the blocks arranged in each of the complete columns of blocks includes successively accessing the blocks arranged in the n banks at each of the row addresses.

18. The memory system according to claim 17, wherein:
the access area setting unit sets the specified range of row addresses by i) dividing the total number of the blocks by n and a number of the complete columns of blocks to obtain a quotient, and ii) setting the specified range of row address such that the specified range of row addresses includes a number of row addresses equal to an integer part of the quotient.

19. The memory system according to claim 18, wherein:
the access area setting unit further arranges an incomplete column of blocks along the direction of the column addresses, the incomplete column of blocks includes less than the first number of the blocks arranged in a portion of the specified range of row addresses; and
the access control unit supplies the addresses signal and the access control signal to the memory such that the two or more complete columns of blocks and the incomplete column of blocks are successively accessed within the frame period.

20. The memory system according to claim 16, wherein the specified range of row addresses is narrower than a range of the row addresses of the address space.

21. The memory system according to claim 16, wherein:
the data is composed of a specified number of words; and
the access area setting unit includes a row address range setting unit that sets the specified range of row addresses in accordance with the specified number of words of the data without changing the specified number of consecutive column addresses of each of the blocks.

22. The memory system according to claim 21, wherein the row address range setting unit receives a data size signal that indicates the specified number of words.

23. The memory system according to claim 16, wherein:
the access area setting unit further arranges an incomplete column of blocks along the direction of the column addresses, the incomplete column of blocks includes less than the first number of the blocks arranged in a portion of the specified range of row addresses; and
the access control unit supplies the addresses signal and the access control signal to the memory such that the two or more complete columns of blocks and the incomplete column of blocks are successively accessed within the frame period.

* * * * *